US012211854B2

(12) United States Patent
Chung et al.

(10) Patent No.: US 12,211,854 B2
(45) Date of Patent: Jan. 28, 2025

(54) ARRAY SUBSTRATE AND MANUFACTURING METHOD THEREFOR, AND DISPLAY PANEL

(71) Applicant: INFOVISION OPTOELECTRONICS (KUNSHAN) CO., LTD., Suzhou (CN)

(72) Inventors: Te-Chen Chung, Suzhou (CN); Chih-Cheng Tsai, Suzhou (CN); Huilong Zheng, Suzhou (CN); Xingang Wang, Suzhou (CN)

(73) Assignee: INFOVISION OPTOELECTRONICS (KUNSHAN) CO., LTD., Suzhou (CN)

( * ) Notice: Subject to any disclaimer, the term of this patent is extended or adjusted under 35 U.S.C. 154(b) by 204 days.

(21) Appl. No.: 18/013,898

(22) PCT Filed: Dec. 10, 2020

(86) PCT No.: PCT/CN2020/135371
§ 371 (c)(1),
(2) Date: Dec. 29, 2022

(87) PCT Pub. No.: WO2022/120746
PCT Pub. Date: Jun. 16, 2022

(65) Prior Publication Data
US 2023/0290788 A1   Sep. 14, 2023

(51) Int. Cl.
*H01L 27/12* (2006.01)
*G02F 1/1343* (2006.01)
(Continued)

(52) U.S. Cl.
CPC .... *H01L 27/1225* (2013.01); *G02F 1/134309* (2013.01); *G02F 1/13439* (2013.01);
(Continued)

(58) Field of Classification Search
None
See application file for complete search history.

(56) References Cited

U.S. PATENT DOCUMENTS

| | | |
|---|---|---|
| 2010/0035379 A1 | 2/2010 | Mityairi et al. |
| 2013/0140557 A1 | 6/2013 | Miyairi et al. |

FOREIGN PATENT DOCUMENTS

| | | | |
|---|---|---|---|
| CN | 101478005 A | 7/2009 | |
| CN | 102842619 A | 12/2012 | |

(Continued)

*Primary Examiner* — Richard H Kim
(74) *Attorney, Agent, or Firm* — Cheng-Ju Chiang (57) ABSTRACT

An array substrate includes a substrate; a gate disposed on the substrate; a first insulating layer covering the gate; a first semiconductor layer and a second semiconductor layer that are provided on the first insulating layer, a channel corresponding to the gate being provided in the first semiconductor layer and second semiconductor layer, the second semiconductor layer including a first metal oxide semiconductor layer and a second metal oxide semiconductor layer which are stacked, both the first metal oxide semiconductor layer and the second metal oxide semiconductor layer being disconnected at the channel, and the oxygen vacancy concentration of the second metal oxide semiconductor layer being less than the oxygen vacancy concentration of the first metal oxide semiconductor layer; and a source and a drain that are provided on the second semiconductor layer, both the source and the drain being in electrically conductive contact with the second semiconductor layer.

20 Claims, 7 Drawing Sheets

(51) Int. Cl.
*G02F 1/1362* (2006.01)
*G02F 1/1368* (2006.01)

(52) U.S. Cl.
CPC ...... *G02F 1/136227* (2013.01); *G02F 1/1368* (2013.01); *H01L 27/127* (2013.01); *G02F 2202/103* (2013.01)

(56) References Cited

FOREIGN PATENT DOCUMENTS

| | | |
|---|---|---|
| CN | 103745980 A | 4/2014 |
| CN | 104681632 A | 6/2015 |
| CN | 104966697 A | 10/2015 |
| CN | 207458949 U | 6/2018 |
| CN | 108305879 A | 7/2018 |
| JP | 2002-353442 A | 12/2002 |
| JP | 2004-128028 A | 4/2004 |
| KR | 10-2011-0077264 A | 7/2011 |

ARRAY SUBSTRATE AND MANUFACTURING METHOD THEREFOR, AND DISPLAY PANEL

CROSS REFERENCE TO RELATED APPLICATIONS

This application is a 35 U.S.C. § 371 National Phase conversion of International (PCT) Patent Application No. PCT/CN2020/135371, filed on Dec. 10, 2020. The PCT International Patent Application was filed and published in Chinese.

BACKGROUND OF THE APPLICATION

Field of the Application

The present application relates to the field of display technology, and in particular, to an array substrate, a manufacturing method therefor, and a display panel having the array substrate.

Description of Related Art

With the development of display technology, the liquid crystal display (LCD) panel is more and more popular because of its advantages of light weight and low radiation. The liquid crystal display panel includes oppositely disposed color filter (CF) substrate and film transistor (TFT) array substrate, and a liquid crystal (LC) layer sandwiched between the two substrates.

Amorphous silicon (a-Si) is currently the most widely used semiconductor layer material in the semiconductor industry. Due to the large potential energy difference between a-Si material and metal, it is difficult to form ohmic contact. In practical applications, in order to obtain the ohmic contact between metal and semiconductor, the semiconductor surface is heavily doped with P (phosphorus) element, so as to reduce the contact resistance between metal and semiconductor and improve the current efficiency. At present, the off-state leakage current ($I_{off}$) of amorphous silicon TFT (thin film transistor) is larger than $10^{-11}$~$10^{-12}$A, and the $I_{on}/I_{off}$ (ratio of on-state current to off-state current) is only $10^6$. When a-Si TFT is driven at low frequency below 30 Hz, the duration of the on-state and the off-state will be longer. At this time, the large off-state leakage current will cause the pixel electrode voltage drop to be too large, which will cause distortion and flickering problems in the display screen, so the low frequency of 30 Hz and below cannot be achieved. Thus, conventional a-Si TFT products cannot switch to the low-frequency refresh mode when the panel displays a still image or is in standby, in order to reduce power consumption.

Figure 1:
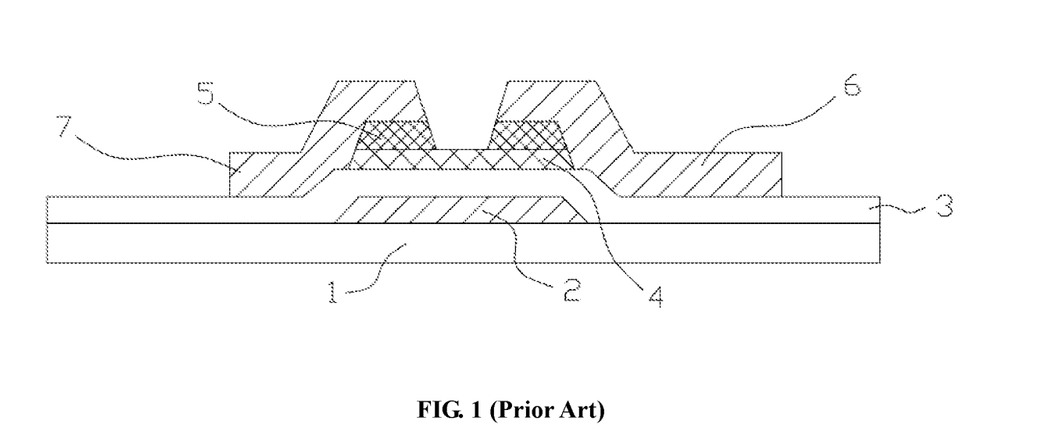
FIG. 1 is a schematic diagram of a conventional array substrate.

FIG. 1 is a schematic cross-sectional view of a conventional array substrate. The array substrate includes a substrate 1, a gate 2 disposed on the substrate 1, a gate insulating layer 3 disposed on the substrate 1 and covering the gate 2, an amorphous silicon layer 4 located above the gate 2 and disposed on the gate insulating layer 3, a doped amorphous silicon layer (n$^+$ a-Si) 5 disposed on the amorphous silicon layer 4, and a source 6 and a drain 7 disposed on the gate insulating layer 3. A middle portion of the doped amorphous silicon layer 5 is recessed downward and forms a channel above the gate 2.

Figure 2:
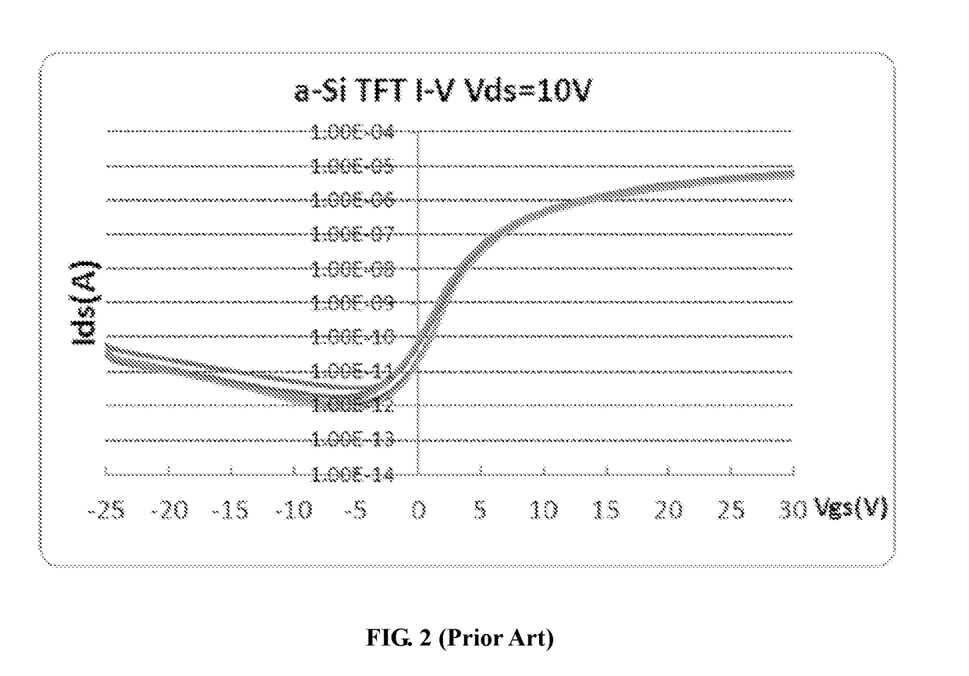
FIG. 2 is a graph showing the leakage current of the a-Si TFT device in the array substrate of FIG. 1.

FIG. 2 is a graph showing the leakage current of the a-Si TFT device in the array substrate of FIG. 1. It can be seen from FIG. 2 that while the array substrate of FIG. 1 increases the operating current ($I_{on}$), there is also a certain problem. That is to say, when a negative voltage is applied to a certain level, positive charges will be drawn out to form a hole conduction channel, and the off-state leakage current ($I_{off}$) will also increase, and the curve will be seriously warped, causing the display screen to appear distortion and flickering issues at low frequency.

BRIEF SUMMARY OF THE APPLICATION

In order to overcome the shortcomings and deficiencies in the prior art, the object of the present application is to provide an array substrate and a manufacturing method therefor, so as to solve the problem that the off-state leakage current of the a-Si device of the array substrate in the prior art is relatively large, resulting poor display effect in low frequency.

The present application provides an array substrate, including:
  a substrate;
  a gate provided on the substrate;
  a first insulating layer covering the gate;
  a first semiconductor layer and a second semiconductor layer provided on the first insulating layer, the second semiconductor layer being stacked on the first semiconductor layer, wherein the first semiconductor layer is an amorphous silicon layer, the second semiconductor layer is a metal oxide semiconductor layer, a channel corresponding to the gate is provided in the first semiconductor layer and the second semiconductor layer;
  the second semiconductor layer includes a first metal oxide semiconductor layer and a second metal oxide semiconductor layer stacked on the first metal oxide semiconductor layer, the first metal oxide semiconductor layer and the second metal oxide semiconductor layer are each disconnected at the channel, the oxygen vacancy concentration of the second metal oxide semiconductor layer is less than the oxygen vacancy concentration of the first metal oxide semiconductor layer;
  a source and a drain provided on the second semiconductor layer, wherein the source and the drain are each in electrically conductive contact with the second semiconductor layer.

Further, the first semiconductor layer includes an amorphous silicon layer and a doped amorphous silicon layer stacked on the amorphous silicon layer, the doped amorphous silicon layer is disconnected at the channel.

Further, the amorphous silicon layer, the doped amorphous silicon layer, the first metal oxide semiconductor layer and the second metal oxide semiconductor layer are stacked sequentially from bottom to top directly above the gate.

Further, the first metal oxide semiconductor layer and the second metal oxide semiconductor layer are each made of indium gallium zinc oxide.

Further, the second semiconductor layer covers the top and both sides of the first semiconductor layer, and the second semiconductor layer separates the first semiconductor layer from the source and the drain.

Further, the source and the drain cover the second metal oxide semiconductor layer, the second metal oxide semiconductor layer is divided into two parts by the channel, and the source and the drain are respectively in electrically conductive contact with the two parts.

Further, the array substrate further includes a second insulating layer, an overcoat layer, a first electrode layer, a third insulating layer and a second electrode layer, the second insulating layer is provided on the first insulating layer and covers the source and the drain, the overcoat layer is provided on the second insulating layer, the first electrode layer is provided on the overcoat layer, the third insulating layer is provided on the overcoat layer and covers the first electrode layer, wherein the third insulating layer, the overcoat layer and the second insulating layer is provided with a contact hole corresponding to the source, and the second electrode layer is provided on the third insulating layer and is in electrically conductive contact with the source via the contact hole.

Further, the array substrate further includes a second insulating layer, a first electrode layer and a second electrode layer, the second electrode layer is provided on the first insulating layer and is in electrically conductive contact with the source, the second insulating layer is provided on the first insulating layer and covers the source, the drain and the second electrode layer, and the first electrode layer is provided on the second insulating layer.

Further, the array substrate further includes a second insulating layer and a second electrode layer, the second insulating layer is provided on the first insulating layer and covers the source and the drain, the second insulating layer is provided with a contact hole corresponding to the source, the second electrode layer is provided on the second insulating layer and is in electrically conductive contact with the source via the contact hole.

The present application further provides a method for manufacturing an array substrate, including:
providing a substrate;
forming a patterned gate on the substrate;
forming a first insulating layer covering the gate on the substrate;
forming a first semiconductor layer and a second semiconductor layer on the first insulating layer, the second semiconductor layer being stacked on the first semiconductor layer, wherein the first semiconductor layer is an amorphous silicon layer, the second semiconductor layer is a metal oxide semiconductor layer, the second semiconductor layer includes a first metal oxide semiconductor layer and a second metal oxide semiconductor layer stacked on the first metal oxide semiconductor layer, the oxygen vacancy concentration of the second metal oxide semiconductor layer is less than the oxygen vacancy concentration of the first metal oxide semiconductor layer;
forming a source and a drain on the second semiconductor layer, wherein the source and the drain are each in electrically conductive contact with the second semiconductor layer;
after the source and the drain are formed, etching the second semiconductor layer and the first semiconductor layer to form a channel.

Further, the first semiconductor layer includes an amorphous silicon layer and a doped amorphous silicon layer, wherein an amorphous silicon film, a doped amorphous silicon film, a first metal oxide semiconductor film and a second metal oxide semiconductor film are sequentially and continuously deposited on the first insulating layer, and then the amorphous silicon film, the doped amorphous silicon film, the first metal oxide semiconductor film and the second metal oxide semiconductor film are etched to form an island-shaped semiconductor structure directly above the gate.

Further, the first semiconductor layer includes an amorphous silicon layer and a doped amorphous silicon layer, wherein an amorphous silicon film and a doped amorphous silicon film are sequentially and continuously deposited on the first insulating layer, the amorphous silicon film and the doped amorphous silicon film are etched to form an island structure directly above the gate, and then a first metal oxide semiconductor film and a second metal oxide semiconductor film are sequentially and continuously deposited on the first insulating layer and cover the first semiconductor layer, the first metal oxide semiconductor film and the second metal oxide semiconductor film are etched to form an island structure directly above the gate, the second semiconductor layer covers the top and both sides of the first semiconductor layer, and the second semiconductor layer separates the first semiconductor layer from the source and the drain.

Further, when forming the patterned gate on the substrate, a first metal layer is deposited on the substrate, and the first metal layer is etched to form the gate; when forming the source and the drain on the second semiconductor layer, a second metal layer is deposited on the first insulating layer and covers the first semiconductor layer and the second semiconductor layer, the second metal layer is etched to form the source and the drain, and a first through hole is formed between the source and the drain, the first through hole corresponds to the location where the channel will be formed thereafter.

Further, when forming the channel by etching the second semiconductor layer and the first semiconductor layer, the source and the drain are used as shields, the second semiconductor layer is etched through the first through hole to form a second through hole, and the first semiconductor layer is exposed from the second through hole, the first semiconductor layer is then etched through the second through hole such that the doped amorphous silicon film is etched and disconnected to form a third through hole, and the channel is formed by the second through hole and the third through hole, wherein the amorphous silicon film forms the amorphous silicon layer after etching, the doped amorphous silicon film forms the doped amorphous silicon layer after etching, the first metal oxide semiconductor film forms the first metal oxide semiconductor layer after etching, and the second metal oxide semiconductor film forms the second metal oxide semiconductor layer after etching.

Further, the first metal oxide semiconductor layer is made from indium gallium zinc oxide by an annealing treatment in a nitrogen atmosphere at a temperature of 300° C. to 450° C. and a time of 20 to 60 minutes; the second metal oxide semiconductor layer is made from indium gallium zinc oxide under the conditions of a sputtering power of 80-110 W and an oxygen partial pressure of 5%-9%, or the second metal oxide semiconductor layer is made from indium gallium zinc oxide by performing N-type doping through a plasma treatment process, or the second metal oxide semiconductor layer is made from indium gallium zinc oxide by a plasma conducting treatment.

Further, the manufacturing method further includes:
forming a second insulating layer and an overcoat layer sequentially on the first insulating layer, wherein the second insulating layer covers the source, the drain and the channel;
forming a first transparent electrode film on the overcoat layer, and etching the first transparent electrode film to form a first electrode layer;
forming a third insulating layer on the first electrode layer, and etching the third insulating layer, the overcoat layer and the second insulating layer to form a contact hole corresponding to the source;

forming a second transparent electrode film covering the contact hole on the third insulating layer, and etching the second transparent electrode film to form a second electrode layer, wherein the second electrode layer is in electrically conductive contact with the source via the contact hole.

Further, the manufacturing method further includes:

before forming the source and the drain, forming a second transparent electrode film on the first insulating layer, and etching the second transparent electrode film to form a second electrode layer;

then forming a second metal layer on the second electrode layer, and etching the second metal layer to form the source and the drain;

thereafter forming a second insulating layer covering the source, the drain, the channel and the second electrode layer, and forming a first transparent electrode film on the second insulating layer, and etching the first transparent electrode film to form a first electrode layer.

Further, the manufacturing method further includes:

forming a second insulating layer on the first insulating layer, the second insulating layer covering the source, the drain and the channel, and etching the second insulating layer to form a contact hole corresponding to the source;

then forming a second transparent electrode film covering the contact hole on the second insulating layer, and etching the second transparent electrode film to form a second electrode layer, wherein the second electrode layer is in electrically conductive contact with the source via the contact hole.

The present application further provides a display panel including a color filter substrate, a liquid crystal layer and the above-mentioned array substrate, wherein the color filter substrate and the array substrate are disposed opposite to each other, and the liquid crystal layer is disposed between the color filter substrate and the array substrate.

In the present application, the first semiconductor layer and the second semiconductor layer are stacked on the substrate of the array substrate, wherein the first semiconductor layer is an amorphous silicon layer, the second semiconductor layer is a metal oxide semiconductor layer. The second semiconductor layer includes a first metal oxide semiconductor layer and a second metal oxide semiconductor layer stacked on the first metal oxide semiconductor layer. The oxygen vacancy concentration of the second metal oxide semiconductor layer is less than the oxygen vacancy concentration of the first metal oxide semiconductor layer. The source and the drain are disposed on the second semiconductor layer, and the source and the drain are each in electrically conductive contact with the second semiconductor layer. The present application solves the high off-state leakage current problem of ordinary a-Si TFTs by depositing two layers of metal oxide semiconductor layers with different oxygen vacancy concentrations above the first semiconductor layer, thus realizing low-frequency drive. The display panel can be switched to low-frequency refresh mode when displaying still picture or in standby mode, so as to reduce power consumption, and also reduce the contact resistance between the source, the drain and the second metal oxide semiconductor layer, effectively increase the on-state current, and improve the response speed.

DETAILED DESCRIPTION OF THE APPLICATION

In order to further illustrate the technical solutions and effects of the present application to achieve its intended purpose, the following describes the specific implementation mode, structures, features and effects of the array substrate, display panel and manufacturing method provided by the present application in combination with the drawings and preferred embodiments as follows.

First Embodiment

Figure 4:
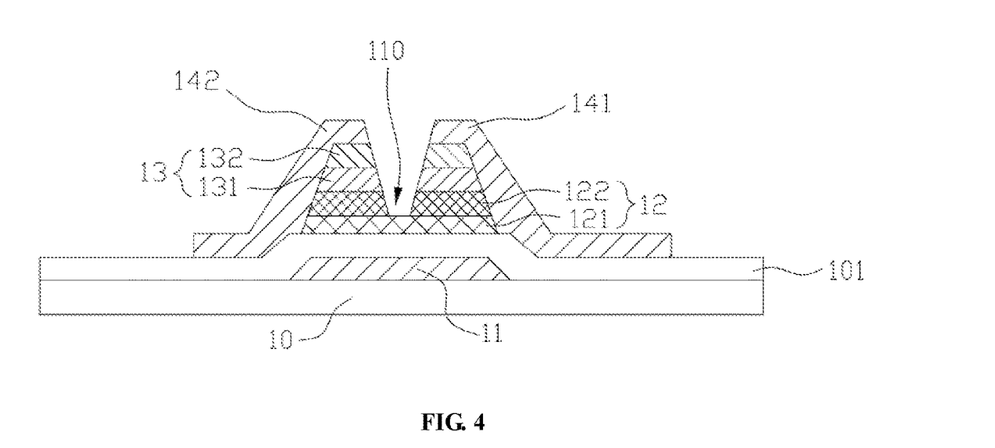
FIG. 4 is a schematic diagram of a TFT device in an array substrate according to the present application.

FIG. 4 is a schematic diagram of a TFT device in an array substrate according to the present application. FIGS. 5a-5j are schematic diagrams in manufacturing the array substrate according to a first embodiment of the present application.

Figure 5A:
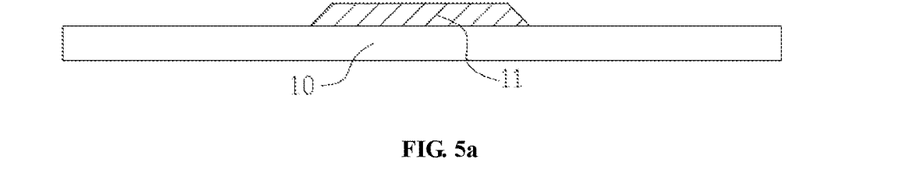
FIGS. 5a-5j are schematic diagrams in manufacturing the array substrate according to a first embodiment of the present application.
Figure 5B:
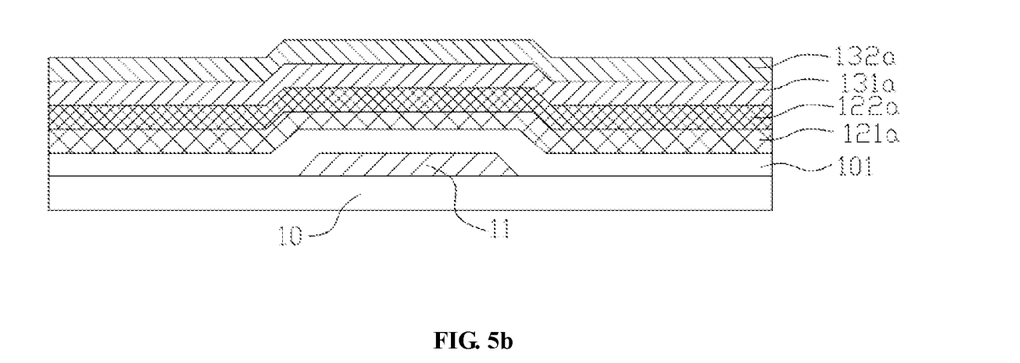
Figure 5C:
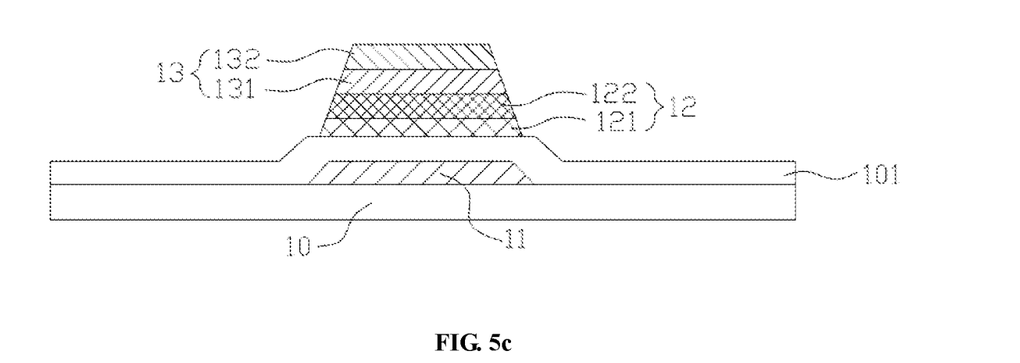
Figure 5D:
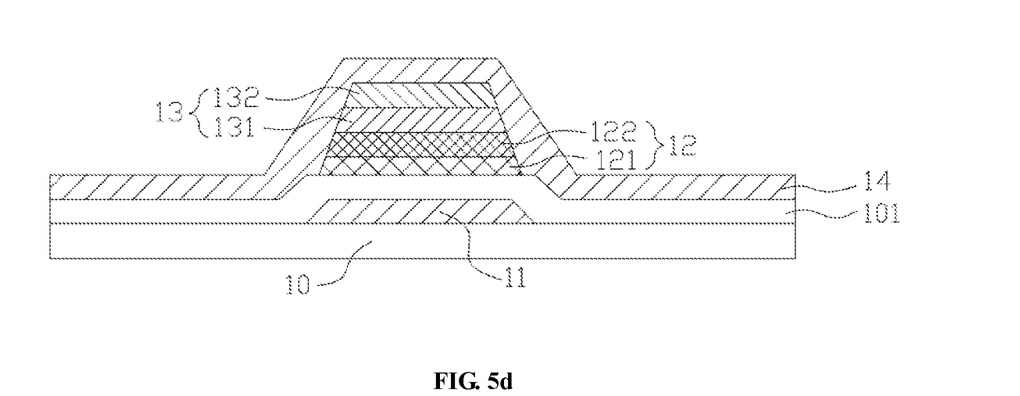
Figure 5E:
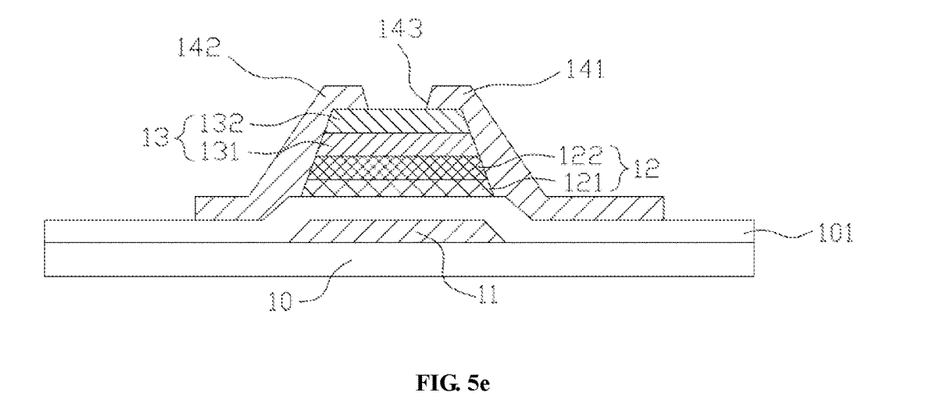
Figure 5F:
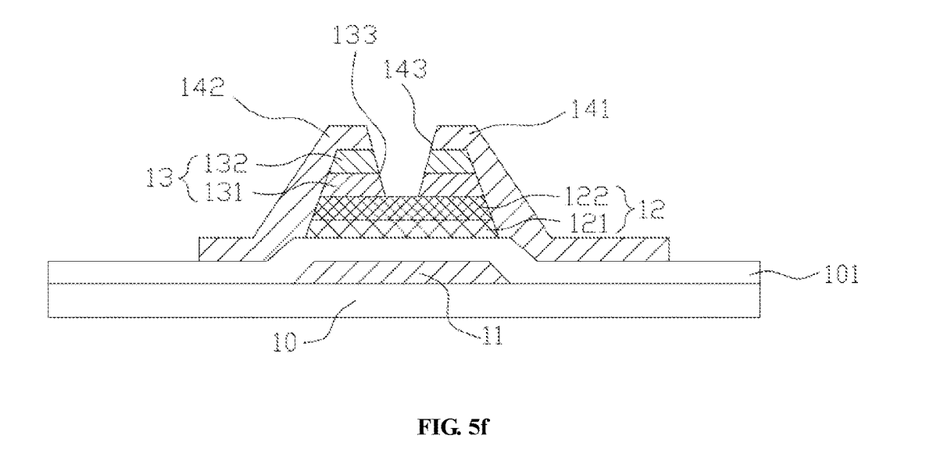
Figure 5G:
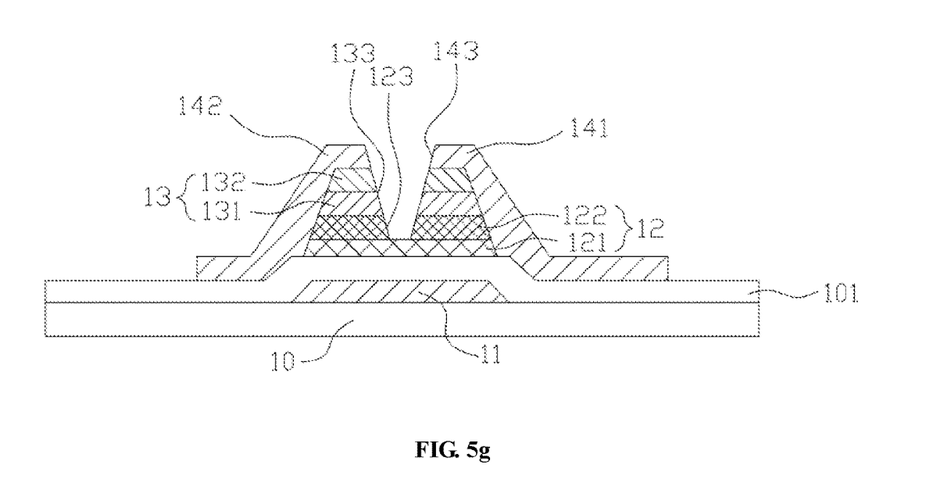
Figure 5H:
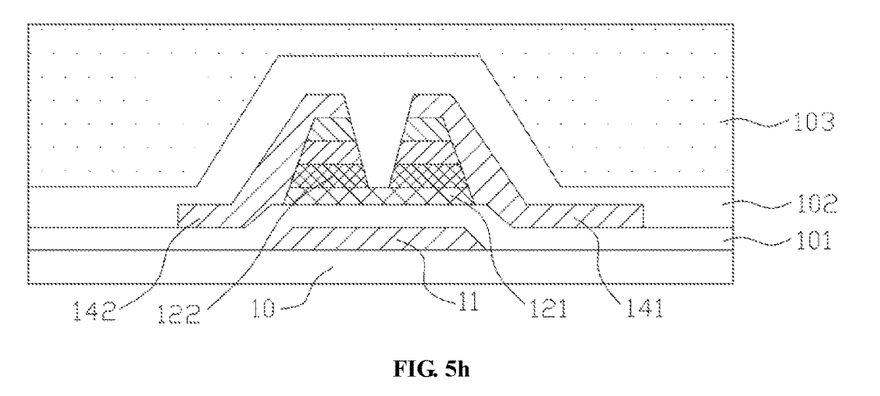
Figure 5I:
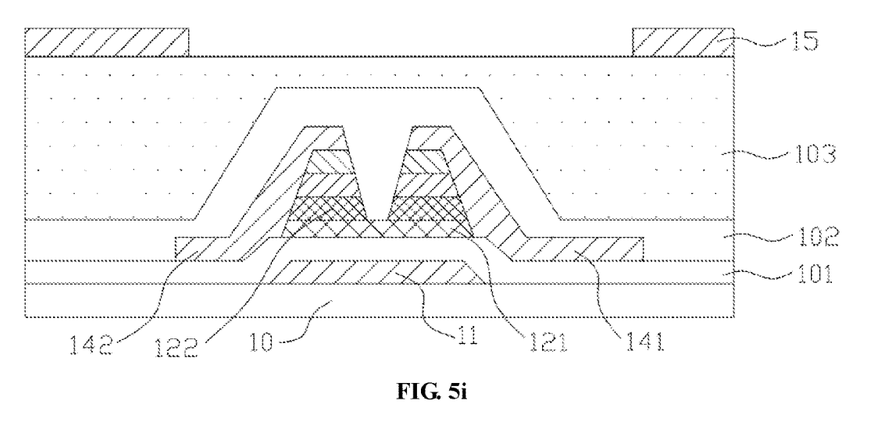
Figure 5J:
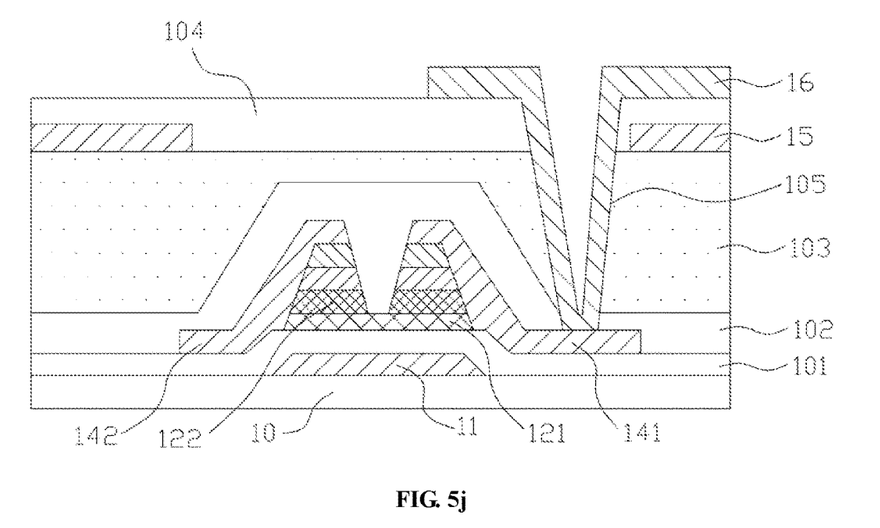

As shown in FIG. 4 to FIG. 5j, an array substrate provided by the first embodiment of the present application includes:

a substrate 10, wherein the substrate 10 may be made of a material such as glass, quartz, acrylic, or polycarbonate;

a gate 11 disposed on the substrate 10, wherein the gate 11 and the scan line (not shown) are located in the same layer and are electrically connected;

a first insulating layer 101 covering the gate 11, wherein the first insulating layer 101 is the gate insulating layer, the first insulating layer 101 is disposed on the entire surface of the substrate 10 and covers the gate 11 and the scan line, the material of the first insulating layer 101 may be silicon oxide (SiOx), silicon nitride (SiNx), or a combination of both.

a first semiconductor layer 12 and a second semiconductor layer 13 that are disposed on the first insulating layer 101, with the second semiconductor layer 13 being stacked on the first semiconductor layer 12, wherein the first semiconductor layer 12 is specifically an amorphous silicon layer, which includes an amorphous silicon layer (a-Si) 121 and a doped amorphous silicon layer (n$^+$-Si) 122 stacked on the amorphous silicon layer 121, the doped amorphous silicon layer 122 is used to reduce the contact resistance between the amorphous silicon layer 121 and the second semiconductor layer 13. The first semiconductor layer 12 has an island structure and is disposed directly above the gate 11. The projected area of the first semiconductor layer 12 on the substrate 10 is less than the projected area of the gate 11 on the substrate 10. The second semiconductor layer 13 is specifically a metal oxide semiconductor layer, which includes a first metal oxide semiconductor layer 131 and a second metal oxide semiconductor layer 132 stacked on the first metal oxide semiconductor layer 131. The oxygen vacancy concentration of the second metal oxide semiconductor layer 132 is less than the oxygen vacancy concentration of the first metal oxide semiconductor layer 131, the second metal oxide semiconductor layer 132 is used to reduce the contact resistance between the first metal oxide semiconductor layer 131 and the source 141 and the drain 142. The amorphous silicon layer 121, the doped amorphous silicon layer 122, the first metal oxide semiconductor layer 131 and the second metal oxide semiconductor layer 132 are sequentially stacked from bottom to top.

The second semiconductor layer 13 has an island structure and is disposed directly above the gate 11. The projected area of the second semiconductor layer 13 on the substrate 10 is less than the projected area of the first semiconductor layer 12 on the substrate 10. Specifically, the amorphous silicon layer 121, the doped amorphous silicon layer 122, the first metal oxide semiconductor layer 131 and the second metal oxide semiconductor layer 132 are sequentially stacked in order from bottom to top above the gate 11. A channel 110 corresponding to the gate 11 is provided in the first semiconductor layer 12 and the second semiconductor layer 13, wherein the doped amorphous silicon layer 122, the first metal oxide semiconductor layer 131 and the second metal oxide semiconductor layer 132 are each disconnected at the channel 110. The holes on the back channel at the interface between the first semiconductor layer 12 and the second insulating layer 102 participate in conduction to form back channel current. Meanwhile, under the combined action of negative Vgs (the voltage difference between the gate and the source) and positive Vds (the voltage difference between the drain and the source), hot ions are generated between the gate 11 and the drain 142 to emit holes, thereby forming hole carriers, so that hole accumulation is formed at the interface between the first semiconductor layer 12 and the first insulating layer 101 to generate hole currents. At this time, the front channel (the part of the channel near the surface of the amorphous silicon layer 121) is the main conduction channel of the TFT device, and the hole carriers at the back channel (the part of the channel far away from the surface of the amorphous silicon layer 121) is the main conductive medium.

a source 141 and a drain 142 disposed on the second semiconductor layer 13, wherein the source 141, the drain 142 and the data line (not shown) are located in the same layer and made of the same layer of metal, the source 141 and the drain 142 are each in electrically conductive contact with the second semiconductor layer 13, the source 141 and the drain 142 are disconnected at the channel 110. Specifically, the source 141 and the drain 142 are disposed on the second metal oxide semiconductor layer 132 and cover the second metal oxide semiconductor layer 132, the second metal oxide semiconductor layer 132 is divided into two parts by the channel 110, the source 141 and the drain 142 are respectively in electrically conductive contact with the two parts.

In this embodiment, the array substrate further includes a second insulating layer 102, an overcoat layer 103, a first electrode layer 15, a third insulating layer 104 and a second electrode layer 16. The second insulating layer 102 is provided on the first insulating layer 101 and covers the source 141 and the drain 142, the overcoat layer 103 is provided on the second insulating layer 102, the first electrode layer 15 is provided on the overcoat layer 103, the third insulating layer 104 is provided on the overcoat layer 103 and covers the first electrode layer 15, wherein the third insulating layer 104, the overcoat layer 103 and the second insulating layer 102 are provided with a contact hole 105 corresponding to the source 141, and the second electrode layer 16 is provided on the third insulating layer 104 and is in electrically conductive contact with the source 141 via the contact hole 105. The first electrode layer 15 serves as the common electrode, and the second electrode layer 16 serves as the pixel electrode. The common electrode 15 and the pixel electrode 16 are located in different layers and are insulated and isolated by the third insulating layer 104. The common electrode 15 may be located above or below the pixel electrode 16 (in FIG. 5j, the common electrode 15 is shown below the pixel electrode 16). Preferably, the common electrode 15 is a planar electrode, and the pixel electrode 16 is a block electrode provided integrally in each pixel unit or a slit electrode with a plurality of electrode strips, so as to form a fringe field switching (FFS) mode. Of course, in other embodiments, the pixel electrode 16 and the common electrode 15 may be located in the same layer, but they are insulated and isolated from each other. Each of the pixel electrode 16 and the common electrode 15 may include a plurality of electrode strips, and the electrode strips of the pixel electrode 16 and the electrode strips of the common electrode 15 are alternately arranged so as to form an in-plane switching (IPS) mode.

In this embodiment, the first metal oxide semiconductor layer 131 and the second metal oxide semiconductor layer 132 are each made of indium gallium zinc oxide (IGZO). Specifically, the oxygen vacancy concentration of the second metal oxide semiconductor layer 132 is less than the oxygen vacancy concentration of the first metal oxide semiconductor layer 131. Indium gallium zinc oxide can be deposited by various methods such as magnetron sputtering or thermal evaporation. The oxygen vacancy concentration represents the oxygen content in the metal oxide semiconductor layer, wherein a higher oxygen vacancy concentration represents a lower oxygen content, and a lower oxygen vacancy concentration represents a higher oxygen content. The first metal oxide semiconductor layer 131 with high oxygen vacancy concentration is deposited on the first semiconductor layer 12, such that the first metal oxide semiconductor layer 131 with high oxygen vacancy concentration can effectively inhibit the hole carriers generated by the a-Si TFT in the off-state, thereby effectively reducing the off-state leakage current of the a-Si TFT in cutoff region. The second metal oxide semiconductor layer 132 with low oxygen vacancy concentration is deposited on the first metal oxide semiconductor layer 131 with high oxygen vacancy concentration to form an n$^+$IGZO layer, such that the second metal oxide semiconductor layer 132 can form Ohmic contact with the source 141 and the drain 142, thereby reducing the contact resistance between the source 141, the drain 142 and the second metal oxide semiconductor layer 132, effectively increasing the on-state current, and improving the response speed.

Figure 3:
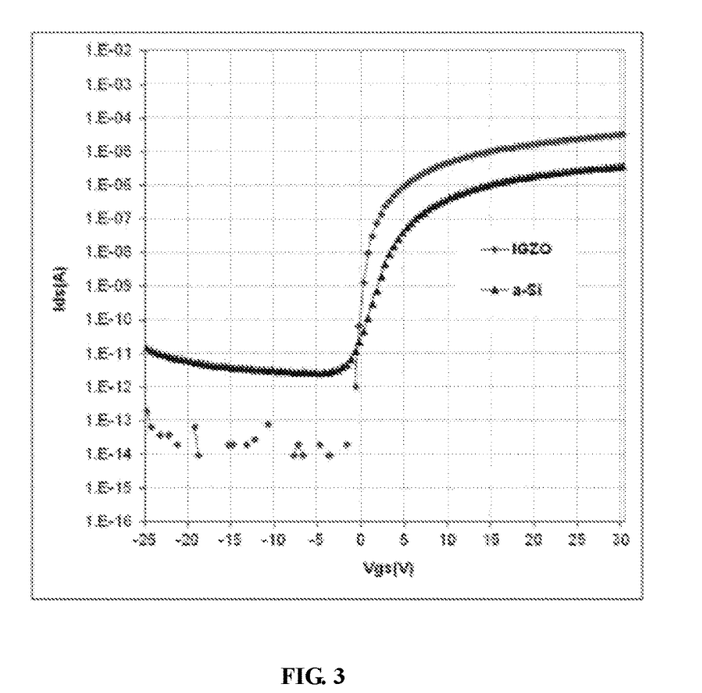
FIG. 3 is a graph showing the leakage current of the a-Si TFT device and the a-IGZO TFT device.

As shown in FIG. 3, although the leakage current of a-IGZO TFT device made of indium gallium zinc oxide is much less than that of a-Si TFT device, the off-state leakage current of a-IGZO TFT is two orders of magnitude less than that of a-Si TFT, about $10^{-13} \sim 10^{-14}$A, but the a-IGZO TFT has the problems of complex manufacturing process and high sensitivity to the process environment. For example, the threshold voltage (Vth) at high temperature or low temperature environment is shifted seriously, and also the IGZO TFT is sensitive to environmental water vapor, O (oxygen) atoms or H (hydrogen) atoms, and will fail due to the infiltration of water vapor, 0 atoms or H atoms into the a-IGZO TFT.

Figure 6:
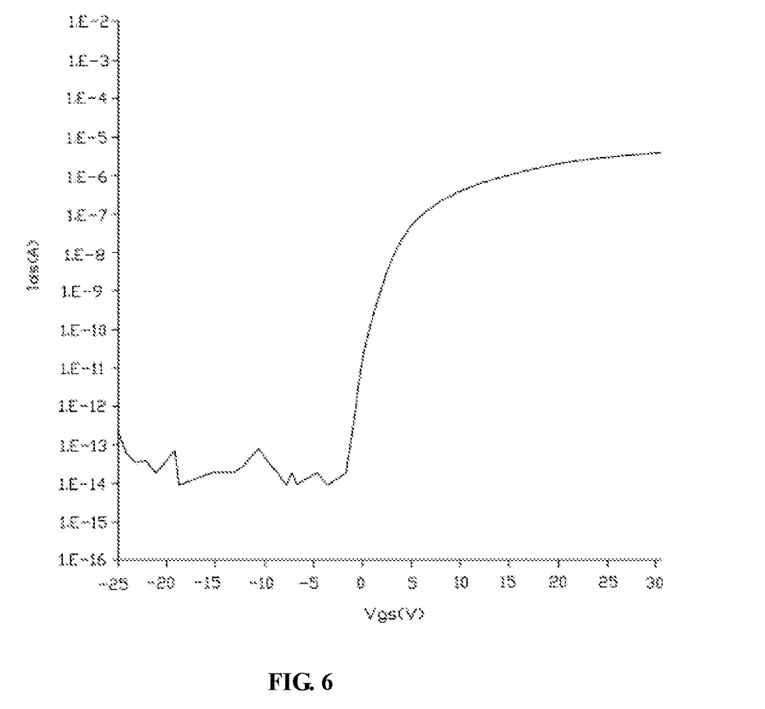
FIG. 6 is a graph showing the leakage current of the TFT device in the array substrate according to the first embodiment of the present application.

On the basis of the first semiconductor layer 12, the present application solves the high off-state leakage current problem of ordinary a-Si TFTs by depositing two layers of metal oxide semiconductor layers with different oxygen vacancy concentrations above the first semiconductor layer 12, thus realizing low-frequency drive. The display panel can be switched to low-frequency refresh mode when displaying still picture or in standby mode, so as to reduce power consumption, and also avoid the problem that the threshold voltage (Vth) of indium gallium zinc oxide is seriously shifted due to environmental impact, as shown in FIG. 6.

Figure 7:
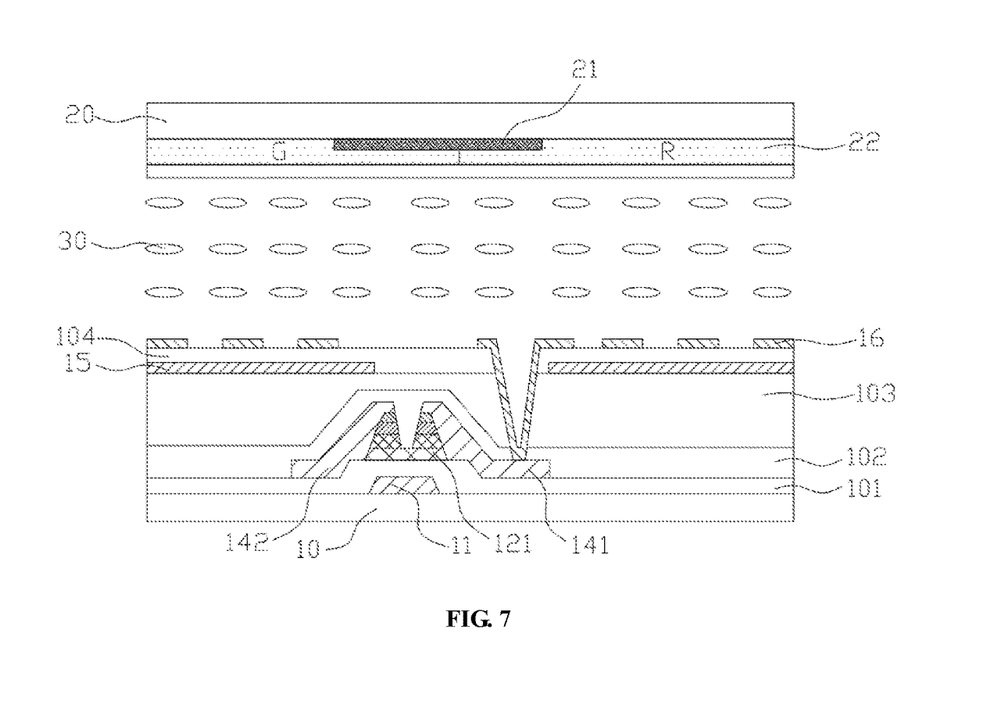
FIG. 7 is a schematic diagram of a display panel according to the first embodiment of the present application.

As shown in FIG. 7, the present application further provides a display panel, which includes a color filter substrate 20, a liquid crystal layer 30 and the above-mentioned array substrate. The color filter substrate 20 is disposed opposite to the array substrate, and the liquid crystal layer 30 is disposed between the color filter substrate 20 and the array substrate.

In this embodiment, positive liquid crystal molecules, that is, liquid crystal molecules with positive dielectric anisotropy, are used in the liquid crystal layer 30. As shown in FIG. 7, in the initial state, the positive liquid crystal molecules in the liquid crystal layer 30 are aligned parallel to the color filter substrate 20 and the array substrate. The alignment direction of the positive liquid crystal molecules near the color film substrate 20 is parallel or anti-parallel to the alignment direction of the positive liquid crystal molecules near the array substrate.

The color filter substrate 20 is provided with color resist layers 22 arranged in an array and a black matrix 21 for separating the color resist layers 22. The color resist layers 22 include resist materials of three colors, i.e., red (R), green (G) and blue (B), so as to form sub-pixels of red (R), green (G), and blue (B) correspondingly.

As shown in FIGS. 5a-5j, the present application also provides a method for manufacturing an array substrate, the manufacturing method includes:

providing a substrate 10, wherein the substrate 10 may be made of a material such as glass, quartz, acrylic, or polycarbonate, among other materials.

forming a patterned gate 11 on the substrate 10. Specifically, as shown in FIG. 5a, a first metal layer is deposited on the substrate 10, and an etching process is used to pattern the first metal layer to form the gate 11 and scan lines (not shown).

forming a first insulating layer 101 covering the gate 11 on the substrate 10. Specifically, as shown in FIG. 5b, a first insulating layer 101 covering the gate 11 and the scan lines is deposited on the substrate 10, the first insulating layer 101 is the gate insulating layer, and the material of the first insulating layer 101 may be silicon oxide (SiOx), silicon nitride (SiNx) or a combination of the two.

forming a first semiconductor layer 12 and a second semiconductor layer 13 on the first insulating layer 101, the second semiconductor layer 13 being stacked on the first semiconductor layer 12. The first semiconductor layer 12 is specifically an amorphous silicon layer, including an amorphous silicon layer 121 and a doped amorphous silicon layer 122 stacked on the amorphous silicon layer 121. The second semiconductor layer 13 is specifically a metal oxide semiconductor layer, including a first metal oxide semiconductor layer 131 and a second metal oxide semiconductor layer 132 stacked on the first metal oxide semiconductor layer 131. The amorphous silicon layer 121, the doped amorphous silicon layer 122, the first metal oxide semiconductor layer 131 and the second metal oxide semiconductor layer 132 are sequentially stacked from bottom to top. Specifically, as shown in FIG. 5b, an amorphous silicon film 121a, a doped amorphous silicon film 122a, a first metal oxide semiconductor film 131a and a second metal oxide semiconductor film 132a are sequentially and continuously deposited on the first insulating layer 101. As shown in FIG. 5c, the amorphous silicon film 121a, the doped amorphous silicon film 122a, the first metal oxide semiconductor film 131a and the second metal oxide semiconductor film 132a are etched by using an etchant capable of simultaneously etching the first semiconductor layer 12 and the second semiconductor layer 13, to form an island-shaped semiconductor layer structure directly above the gate 11, but at this time, the channel 110 is not yet formed. Alternatively, the second semiconductor layer 13 may be etched firstly by using an etchant capable of etching the second semiconductor layer 13 only, and then, under the shielding of the second semiconductor layer 13, the first semiconductor layer 12 is etched by using an etchant capable of etching the first semiconductor layer 12 only.

forming a source 141 and a drain 142 on the second semiconductor layer 13, wherein the source 141 and the drain 142 are each in electrically conductive contact with the second semiconductor layer 13. Specifically, as shown in FIG. 5d, a second metal layer 14 covering the first semiconductor layer 12 and the second semiconductor layer 13 is deposited on the first insulating layer 101. As shown in FIG. 5e, the second metal layer 14 is patterned by an etching process to form the source 141, the drain 142 and data lines (not shown). A first through hole 143 is formed between the source 141 and the drain 142, and the first through hole 143 corresponds to the position where the channel 110 will be formed thereafter. Through continuous film formation of the first semiconductor layer 12 and the second semiconductor layer 13, the second semiconductor layer 13 is protected by the dense second metal layer 14, and the surface thereof is less affected by subsequent processes. It is difficult for water vapor, O atoms or H atoms existing in the external environment to contact the IGZO film, and the film characteristics are protected.

After the source 141 and the drain 142 are formed, the second semiconductor layer 13 and the first semiconductor layer 12 are etched to form the channel 110. Specifically, as shown in FIG. 5f, using the source 141 and the drain 142 as shields, the second semiconductor layer 13 is etched through the first through hole 143 to form a second through hole 133, and the first semiconductor layer 12 is exposed from the second through hole 133. As shown in FIG. 5g, the first semiconductor layer 12 is etched through the second through hole 133, and the etching time is controlled so that the doped amorphous silicon film 122a is etched and disconnected to form a third through hole 123 while the amorphous silicon layer 121 can be etched a little, and the channel 110 is formed by the second through hole 133 and the third through hole 123. Specifically, different etchants can be used to etch the second semiconductor layer 13 and the first semiconductor layer 12. The amorphous silicon film 121a forms the amorphous silicon layer 121 after etching, the doped amorphous silicon film 122a forms the doped amorphous silicon layer 122 after etching, the first metal oxide semiconductor film 131a forms the first metal oxide semiconductor layer 131 after etching, and the second metal oxide semiconductor film 132a forms the second metal oxide semiconductor layer 132 after etching.

Further, as shown in FIG. 5h, a second insulating layer 102 and an overcoat layer 103 are sequentially formed on the first insulating layer 101, and the second insulating layer 102 covers the source 141, the drain 142 and the channel 110. As shown in FIG. 5i, a first transparent electrode film is formed on the overcoat layer 103, and the first transparent electrode film is etched to form a first electrode layer 15, and the first electrode layer 15 serves as the common electrode. As shown in FIG. 5j, a third insulating layer 104 is formed on the first electrode layer 15, and the third insulating layer 104, the overcoat layer 103 and the second insulating layer 102 are etched to form a contact hole 105 corresponding to the source 141, such that the source 141 is exposed from the contact hole 105, and then a second transparent electrode film covering the contact hole 105 is formed on the third insulating layer 104, and the second transparent electrode film is etched to form a second electrode layer 16. The second electrode layer 16 is in electrically conductive contact with the source 141 via the contact hole 105, and the second electrode layer 16 serves as the pixel electrode.

In this embodiment, the first metal oxide semiconductor layer 131 and the second metal oxide semiconductor layer 132 are each made of indium gallium zinc oxide (IGZO), and indium gallium zinc oxide can be deposited by various methods such as magnetron sputtering or thermal evaporation. Specifically, the oxygen vacancy concentration of the second metal oxide semiconductor layer 132 is less than the oxygen vacancy concentration of the first metal oxide semiconductor layer 131, such that the second metal oxide semiconductor layer 132 forms an n$^+$IGZO layer, and the second metal oxide semiconductor layer 132 forms Ohmic contact with the source 141 and the drain 142, so as to effectively reduce the contact resistance between the source 141, the drain 142 and the second metal oxide semiconductor layer 132, effectively increase the on-state current, and improve the response speed.

Specifically, the first metal oxide semiconductor layer 131 is made from indium gallium zinc oxide by an annealing treatment in a nitrogen atmosphere at a temperature of 300° C. to 450° C. and a time of 20 to 60 minutes; the second metal oxide semiconductor layer 132 is made from indium gallium zinc oxide under the conditions of a sputtering power of 80-110 W and an oxygen partial pressure of 5%-9%, such that the oxygen vacancy concentration of the second metal oxide semiconductor layer 132 is less than that of the first metal oxide semiconductor layer 131, thereby reducing the contact resistance between the second metal oxide semiconductor layer 132 and the source 141 and the drain 142. In other embodiments, the second metal oxide semiconductor layer 132 is made from indium gallium zinc oxide by performing N-type doping through a plasma treatment process to form n$^+$IGZO region, such that the oxygen vacancy concentration of the second metal oxide semiconductor layer 132 is less than that of the first metal oxide semiconductor layer 131, so as to reduce the contact resistance between the second metal oxide semiconductor layer 132 and the source 141 and the drain 142; or the second metal oxide semiconductor layer 132 is made from indium gallium zinc oxide through a plasma conducting treatment, such that the oxygen vacancy concentration of the second metal oxide semiconductor layer 132 is less than that of the first metal oxide semiconductor layer 131, the second metal oxide semiconductor layer 132 obtains low contact resistance and reduces the contact resistance between the second metal oxide semiconductor layer 132 and the source 141 and the drain 142.

Second Embodiment

Figure 8:
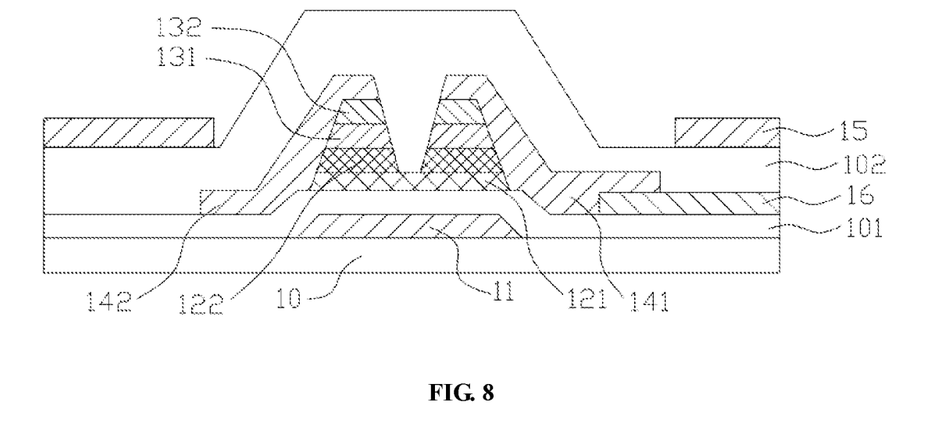
FIG. 8 is a schematic diagram of an array substrate according to a second embodiment of the present application.

FIG. 8 is a schematic diagram of an array substrate in the second embodiment of the present application. As shown in FIG. 8, the difference between the array substrate provided in the second embodiment and the array substrate in the first embodiment (FIG. 4 to FIG. 5j) is that in this embodiment, the array substrate omits the overcoat layer 103 and the third insulating layer 104, and the arrangement order of the first electrode layer 15 and the second electrode layer 16 are changed. Specifically, the second electrode layer 16 is provided on the first insulating layer 101 and is in electrically conductive contact with the source 141, and the second insulating layer 102 is provided on the first insulating layer 101 and covers the source 141, the drain 142 and the second electrode layer 16, and the first electrode layer 15 is disposed on the second insulating layer 102.

Specifically, before the source 141 and the drain 142 are formed, a second transparent electrode film is firstly formed on the first insulating layer 101, and the second transparent electrode film is etched to form the second electrode layer 16; a second metal layer 14 is formed on the second electrode layer 16, and the second metal layer 14 is patterned by an etching process to form the source 141, the drain 142 and data lines (not shown); then, a second insulating layer 102 is formed and covers the source 141, the drain 142, the channel 110 and the second electrode layer 16, and a first transparent electrode film is formed on the second insulating layer 102, the first transparent electrode film is etched to form the first electrode layer 15. The first electrode layer 15 is used as the common electrode, and the second electrode layer 16 is used as the pixel electrode. Compared with the first embodiment, the present embodiment reduces the processes of manufacturing the overcoat layer 103 and the third insulating layer 104 and the process of manufacturing the contact hole 105.

It should be understood by those skilled in the art that the remaining structures and working principles of this embodiment are the same as those of the first embodiment, which will not be repeated herein.

Third Embodiment

Figure 9:
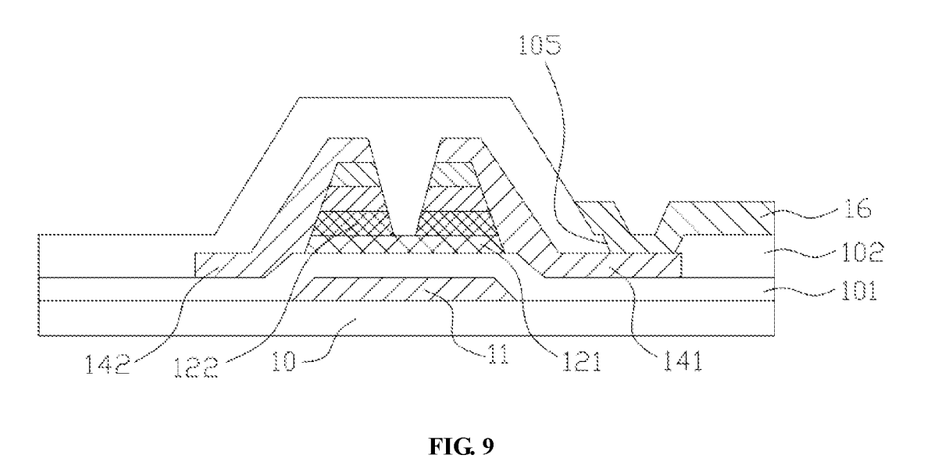
FIG. 9 is a schematic diagram of an array substrate according to a third embodiment of the present application.

FIG. 9 is a schematic diagram of an array substrate in the third embodiment of the present application. As shown in FIG. 9, the difference between the array substrate provided in the third embodiment and the array substrate in the first embodiment (FIG. 4 to FIG. 5j) is that in this embodiment, the array substrate omits the overcoat layer 103, the first electrode layer 15 and the third insulating layer 104. Specifically, the second insulating layer 102 is provided on the first insulating layer 101 and covers the source 141 and the drain 142, the second insulating layer 102 is provided with a contact hole 105 corresponding to the source 141, and the second electrode layer 16 is provided on the second insulating layer 102 and is in electrically conductive contact with the source 141 via the contact hole 105.

Specifically, a second insulating layer 102 covering the source 141, the drain 142 and the channel 110 is formed on the first insulating layer 101, and the second insulating layer 102 is etched to form a contact hole 105 corresponding to the source 141; then, a second transparent electrode film covering the contact hole 105 is formed on the second insulating layer 102, and the second transparent electrode film is etched to form a second electrode layer 16, and the second electrode layer 16 is in electrically conductive contact with the source 141 via the contact hole 105. The second electrode layer 16 serves as the pixel electrode. Compared with the first embodiment, this embodiment reduces the processes of manufacturing the overcoat layer 103, the first electrode layer 15 and the third insulating layer 104. Moreover, the array substrate in this embodiment is not provided with a common electrode, and the common electrode may be optionally provided on the color filter substrate, so as to be suitable for the TN display mode or the VA display mode.

It should be understood by those skilled in the art that the remaining structures and working principles of this embodiment are the same as those of the first embodiment, which will not be repeated herein.

Fourth Embodiment

Figure 10:
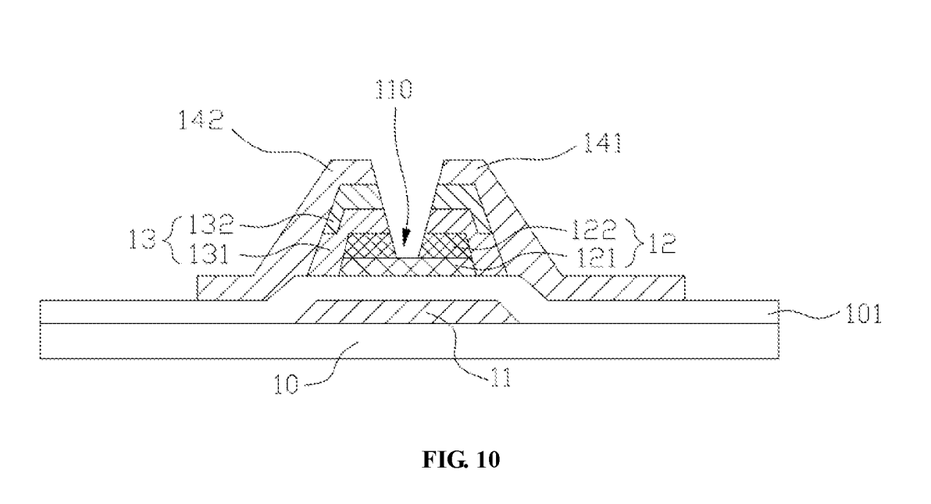
FIG. 10 is a schematic diagram of an array substrate according to a fourth embodiment of the present application.

FIG. 10 is a schematic diagram of an array substrate in the fourth embodiment of the present application. As shown in FIG. 10, the difference between the array substrate provided in the fourth embodiment and the array substrate in the first embodiment (FIG. 4 to FIG. 5*j*) is that in this embodiment, the second semiconductor layer 13 covers the top and both sides of the first semiconductor layer 12, and the second semiconductor layer 13 separates the first semiconductor layer 12 from the source 141 and the drain 142. Thus, the amorphous silicon layer 121 and the doped amorphous silicon layer 122 in the first semiconductor layer 12 are prevented from directly contacting the source 141 and the drain 142, and the off-state leakage current is more effectively reduced, thereby realizing low-frequency drive.

In this embodiment, the first metal oxide semiconductor layer 131 covers the top and both sides of the first semiconductor layer 12, two sides of the first metal oxide semiconductor layer 131 are further provided with steps, and the second metal oxide semiconductor layer 132 covers the top and the steps of the first metal oxide semiconductor layer 131 to increase the contact area between the second metal oxide semiconductor layer 132 and the source 141 and the drain 142, which is more conducive to reducing contact resistance. Of course, in other embodiments, the second metal oxide semiconductor layer 132 may cover the top of the first metal oxide semiconductor layer 131, both sides of the first metal oxide semiconductor layer 131 and both sides of the first semiconductor layer 12, to further reduce the contact resistance; or alternatively, the first metal oxide semiconductor layer 131 covers the top and both sides of the first semiconductor layer 12, the second metal oxide semiconductor layer 132 covers the top and both sides of the first metal oxide semiconductor layer 131, and the bottoms of the first metal oxide semiconductor layer 131 and the second metal oxide semiconductor layer 132 are each in contact with the first insulating layer 101.

The method of manufacturing the array substrate of this embodiment is generally the same as that of the first embodiment, except that the first semiconductor layer 12 is firstly etched to form an island structure, then the first metal oxide semiconductor layer 131 is covered and etched, then the second metal oxide semiconductor layer 132 is covered and etched, and finally the source 141 and the drain 142 are formed, and then the channel 110 is formed and etched.

Specifically, an amorphous silicon film 121*a* and a doped amorphous silicon film 122*a* are sequentially and continuously deposited on the first insulating layer 101, and the amorphous silicon film 121*a* and the doped amorphous silicon film 122*a* are etched by using an etchant capable of etching the first semiconductor layer 12, to form an island-shaped semiconductor layer structure directly above the gate 11, but at this time, the channel 110 is not yet formed. Then, a first metal oxide semiconductor layer 131 and a second metal oxide semiconductor layer 132 are deposited on the first insulating layer 101, the first metal oxide semiconductor layer 131 completely covers the amorphous silicon film 121*a* and the doped amorphous silicon film 122*a*, and the first metal oxide semiconductor layer 131 and the second metal oxide semiconductor layer 132 are etched simultaneously to form into an island-like structure. At this time, the tops of the amorphous silicon film 121*a*, the doped amorphous silicon film 122*a*, the first metal oxide semiconductor layer 131 and the second metal oxide semiconductor layer 132 are not etched to form the channel 110.

A second metal layer 14 is deposited on the first insulating layer 101 and covers the first semiconductor layer 12 and the second semiconductor layer 13. The second metal layer 14 is patterned by an etching process to form the source 141, the drain 142 and data lines (not shown), a first through hole 143 is formed between the source 141 and the drain 142, and the first through hole 143 corresponds to the location where the channel 110 is to be formed thereafter. Through continuous film formation of the first semiconductor layer 12 and the second semiconductor layer 13, the second semiconductor layer 13 is protected by the dense second metal layer 14, and the surface is less affected by subsequent processes. It is difficult for water vapor, O atoms or H atoms existing in the external environment to contact the IGZO film, and the film characteristics are protected.

After the source 141 and the drain 142 are formed, the second semiconductor layer 13 and the first semiconductor layer 12 are etched to form the channel 110. Specifically, the source 141 and the drain 142 are used as shields, the second semiconductor layer 13 is etched through the first through hole 143 to form a second through hole 133, and the first semiconductor layer 12 is exposed from the second through hole 133. Then, the first semiconductor layer 12 is etched through the second through hole 133, and the etching time is controlled, such that the doped amorphous silicon film 122*a* is etched and disconnected to form the third through hole 123, while the amorphous silicon layer 121 may be etched a little, wherein the channel 110 is formed by the second through hole 133 and the third through hole 123.

It should be understood by those skilled in the art that the remaining structures and working principles of this embodiment are the same as those of the first embodiment, which will not be repeated herein.

In this document, the directional terms such as "up", "down", "left", "right", "front" and "back" are defined by the positions of the structures in the drawings and the positions between the structures, and are only for clearly and conveniently expressing technical solutions. It should be understood that the use of the directional terms should not limit the scope of protection claimed in this application. It should also be understood that the terms "first" and "second", etc. used herein are only used to distinguish elements, and are not used to limit the number and order.

The above descriptions are only preferred embodiments of the present application, and do not limit the present application in any form. Although the present application has been disclosed above with preferred embodiments, it is not intended to limit the present application. The persons skilled in the art may make some changes or modifications by using the technical content disclosed above, and if they do not depart from the technical content of the present application, any simple modifications, equivalent changes and modifications made to the above embodiments still fall within the protection scope of the technical solution of the present application.

What is claimed is:

1. An array substrate, comprising:
   a substrate;
   a gate provided on the substrate;
   a first insulating layer covering the gate;
   a first semiconductor layer and a second semiconductor layer provided on the first insulating layer, the second semiconductor layer being stacked on the first semiconductor layer, wherein the first semiconductor layer is an amorphous silicon layer, the second semiconductor layer is a metal oxide semiconductor layer, a channel corresponding to the gate is provided in the first semiconductor layer and the second semiconductor layer;
   the second semiconductor layer comprises a first metal oxide semiconductor layer and a second metal oxide semiconductor layer stacked on the first metal oxide semiconductor layer, the first metal oxide semiconductor layer and the second metal oxide semiconductor layer are each disconnected at the channel, the oxygen vacancy concentration of the second metal oxide semiconductor layer is less than the oxygen vacancy concentration of the first metal oxide semiconductor layer;
   a source and a drain provided on the second semiconductor layer, wherein the source and the drain are each in electrically conductive contact with the second semiconductor layer.

2. The array substrate according to claim 1, wherein the first semiconductor layer comprises an amorphous silicon layer and a doped amorphous silicon layer stacked on the amorphous silicon layer, the doped amorphous silicon layer is disconnected at the channel.

3. The array substrate according to claim 2, wherein the amorphous silicon layer, the doped amorphous silicon layer, the first metal oxide semiconductor layer and the second metal oxide semiconductor layer are stacked sequentially from bottom to top directly above the gate.

4. The array substrate according to claim 1, wherein the first metal oxide semiconductor layer and the second metal oxide semiconductor layer are each made of indium gallium zinc oxide.

5. The array substrate according to claim 1, wherein the second semiconductor layer covers the top and both sides of the first semiconductor layer, and the second semiconductor layer separates the first semiconductor layer from the source and the drain.

6. The array substrate according to claim 1, wherein the source and the drain cover the second metal oxide semiconductor layer, the second metal oxide semiconductor layer is divided into two parts by the channel, and the source and the drain are respectively in electrically conductive contact with the two parts.

7. The array substrate according to claim 1, wherein the array substrate further comprises a second insulating layer, an overcoat layer, a first electrode layer, a third insulating layer and a second electrode layer, the second insulating layer is provided on the first insulating layer and covers the source and the drain, the overcoat layer is provided on the second insulating layer, the first electrode layer is provided on the overcoat layer, the third insulating layer is provided on the overcoat layer and covers the first electrode layer, wherein the third insulating layer, the overcoat layer and the second insulating layer is provided with a contact hole corresponding to the source, and the second electrode layer is provided on the third insulating layer and is in electrically conductive contact with the source via the contact hole.

8. The array substrate according to claim 1, wherein the array substrate further comprises a second insulating layer, a first electrode layer and a second electrode layer, the second electrode layer is provided on the first insulating layer and is in electrically conductive contact with the source, the second insulating layer is provided on the first insulating layer and covers the source, the drain and the second electrode layer, and the first electrode layer is provided on the second insulating layer.

9. The array substrate according to claim 1, wherein the array substrate further comprises a second insulating layer and a second electrode layer, the second insulating layer is provided on the first insulating layer and covers the source and the drain, the second insulating layer is provided with a contact hole corresponding to the source, the second electrode layer is provided on the second insulating layer and is in electrically conductive contact with the source via the contact hole.

10. A display panel comprising a color filter substrate, a liquid crystal layer and the array substrate according to claim 1, wherein the color filter substrate and the array are disposed opposite to each other, and the liquid crystal layer is disposed between the color filter substrate and the array substrate.

11. A method for manufacturing an array substrate, comprising:
    providing a substrate;
    forming a patterned gate on the substrate;
    forming a first insulating layer covering the gate on the substrate;
    forming a first semiconductor layer and a second semiconductor layer on the first insulating layer, the second semiconductor layer being stacked on the first semiconductor layer, wherein the first semiconductor layer is an amorphous silicon layer, the second semiconductor layer is a metal oxide semiconductor layer, the second semiconductor layer comprises a first metal oxide semiconductor layer and a second metal oxide semiconductor layer stacked on the first metal oxide semiconductor layer, the oxygen vacancy concentration of the second metal oxide semiconductor layer is less than the oxygen vacancy concentration of the first metal oxide semiconductor layer;
    forming a source and a drain on the second semiconductor layer, wherein the source and the drain are each in electrically conductive contact with the second semiconductor layer;
    after the source and the drain are formed, etching the second semiconductor layer and the first semiconductor layer to form a channel.

12. The manufacturing method according to claim 11, wherein the first semiconductor layer comprises an amorphous silicon layer and a doped amorphous silicon layer, wherein an amorphous silicon film, a doped amorphous silicon film, a first metal oxide semiconductor film and a second metal oxide semiconductor film are sequentially and continuously deposited on the first insulating layer, and then the amorphous silicon film, the doped amorphous silicon film, the first metal oxide semiconductor film and the second metal oxide semiconductor film are etched to form an island-shaped semiconductor structure directly above the gate.

13. The manufacturing method according to claim 12, wherein when forming the patterned gate on the substrate, a first metal layer is deposited on the substrate, and the first metal layer is etched to form the gate; when forming the source and the drain on the second semiconductor layer, a second metal layer is deposited on the first insulating layer and covers the first semiconductor layer and the second semiconductor layer, the second metal layer is etched to form the source and the drain, and a first through hole is formed between the source and the drain, the first through hole corresponds to the location where the channel will be formed thereafter.

14. The manufacturing method according to claim 13, wherein when forming the channel by etching the second semiconductor layer and the first semiconductor layer, the source and the drain are used as shields, the second semiconductor layer is etched through the first through hole to form a second through hole, and the first semiconductor layer is exposed from the second through hole, the first semiconductor layer is then etched through the second through hole such that the doped amorphous silicon film is etched and disconnected to form a third through hole , and the channel is formed by the second through hole and the third through hole, wherein the amorphous silicon film forms the amorphous silicon layer after etching, the doped amorphous silicon film forms the doped amorphous silicon layer after etching, the first metal oxide semiconductor film forms the first metal oxide semiconductor layer after etching, and the second metal oxide semiconductor film forms the second metal oxide semiconductor layer after etching.

15. The manufacturing method according to claim 11, wherein the first semiconductor layer comprises an amorphous silicon layer and a doped amorphous silicon layer, wherein an amorphous silicon film and a doped amorphous silicon film are sequentially and continuously deposited on the first insulating layer, the amorphous silicon film and the doped amorphous silicon film are etched to form an island structure directly above the gate, and then a first metal oxide semiconductor film and a second metal oxide semiconductor film are sequentially and continuously deposited on the first insulating layer and cover the first semiconductor layer, the first metal oxide semiconductor film and the second metal oxide semiconductor film are etched to form an island structure directly above the gate, the second semiconductor layer covers the top and both sides of the first semiconductor layer, and the second semiconductor layer separates the first semiconductor layer from the source and the drain.

16. The manufacturing method according to claim 11, wherein the first metal oxide semiconductor layer is made from indium gallium zinc oxide by an annealing treatment in a nitrogen atmosphere at a temperature of 300°° C. to 450° C. and a time of 20 to 60 minutes; the second metal oxide semiconductor layer is made from indium gallium zinc oxide under the conditions of a sputtering power of 80-110 W and an oxygen partial pressure of 5%-9%, or the second metal oxide semiconductor layer is made from indium gallium zinc oxide by performing N-type doping through a plasma treatment process, or the second metal oxide semiconductor layer is made from indium gallium zinc oxide by a plasma conducting treatment.

17. The manufacturing method according to claim 11, further comprising:

forming a second insulating layer and an overcoat layer sequentially on the first insulating layer, wherein the second insulating layer covers the source, the drain and the channel;

forming a first transparent electrode film on the overcoat layer, and etching the first transparent electrode film to form a first electrode layer;

forming a third insulating layer on the first electrode layer, and etching the third insulating layer, the overcoat layer and the second insulating layer to form a contact hole corresponding to the source;

forming a second transparent electrode film covering the contact hole on the third insulating layer, and etching the second transparent electrode film to form a second electrode layer, wherein the second electrode layer is in electrically conductive contact with the source via the contact hole.

18. The manufacturing method according to claim 11, further comprising:

before forming the source and the drain, forming a second transparent electrode film on the first insulating layer, and etching the second transparent electrode film to form a second electrode layer;

then forming a second metal layer on the second electrode layer, and etching the second metal layer to form the source and the drain;

thereafter forming a second insulating layer covering the source, the drain, the channel and the second electrode layer, and forming a first metal layer transparent electrode film on the second insulating layer, and etching the first metal layer transparent electrode film to form a first electrode layer.

19. The manufacturing method according to claim 11, further comprising:

forming a second insulating layer on the first insulating layer, the second insulating layer covering the source, the drain and the channel, and etching the second insulating layer to form a contact hole corresponding to the source;

then forming a second transparent electrode film covering the contact hole on the second insulating layer, and etching the second transparent electrode film to form a second electrode layer, wherein the second electrode layer is in electrically conductive contact with the source via the contact hole.

20. The manufacturing method according to claim 15, wherein when forming the patterned gate on the substrate, a first metal layer is deposited on the substrate, and the first metal layer is etched to form the gate; when forming the source and the drain on the second semiconductor layer, a second metal layer is deposited on the first insulating layer and covers the first semiconductor layer and the second semiconductor layer, the second metal layer is etched to form the source and the drain, and a first through hole is formed between the source and the drain, the first through hole corresponds to the location where the channel will be formed thereafter.

* * * * *